United States Patent
Passmore et al.

(10) Patent No.: US 10,157,725 B2
(45) Date of Patent: Dec. 18, 2018

(54) ELECTRON MICROSCOPY SAMPLE SUPPORT INCLUDING POROUS METAL FOIL

(71) Applicant: MEDICAL RESEARCH COUNCIL, Swindon (GB)

(72) Inventors: Lori A. Passmore, Cambridge (GB); Christopher J. Russo, Cambridge (GB)

(73) Assignee: UNITED KINGDOM RESEARCH AND INNOVATION, Swindon (GB)

( * ) Notice: Subject to any disclaimer, the term of this patent is extended or adjusted under 35 U.S.C. 154(b) by 73 days.

(21) Appl. No.: 14/911,723

(22) PCT Filed: Aug. 12, 2014

(86) PCT No.: PCT/GB2014/052454
§ 371 (c)(1),
(2) Date: Feb. 11, 2016

(87) PCT Pub. No.: WO2015/022510
PCT Pub. Date: Feb. 19, 2015

(65) Prior Publication Data
US 2016/0189919 A1 Jun. 30, 2016

Related U.S. Application Data

(60) Provisional application No. 61/865,365, filed on Aug. 13, 2013.

(30) Foreign Application Priority Data

Oct. 29, 2013 (GB) .................................. 1319070.7
Jun. 20, 2014 (WO) ................ PCT/GB2014/051896

(51) Int. Cl.
*H01J 37/20* (2006.01)
*H01J 37/06* (2006.01)
*H01J 37/26* (2006.01)

(52) U.S. Cl.
CPC .............. *H01J 37/20* (2013.01); *H01J 37/06* (2013.01); *H01J 37/26* (2013.01);
(Continued)

(58) Field of Classification Search
CPC .. H01J 37/06; H01J 37/20; H01J 37/26; H01J 2237/26; H01J 2237/2001; H01J 2237/2004; G01N 1/42
See application file for complete search history.

(56) References Cited

U.S. PATENT DOCUMENTS

| 9,947,505 B2 * | 4/2018 | Russo ..................... H01J 37/20 |
| 2010/0243482 A1 * | 9/2010 | Chao ........................ G01N 1/42 205/792 |
| 2011/0200787 A1 | 8/2011 | Regan et al. |

FOREIGN PATENT DOCUMENTS

| EP | 2278306 A1 | 1/2011 |
| EP | 2584584 A1 | 4/2013 |

(Continued)

OTHER PUBLICATIONS

S. Janbroers et al.: "Preparation of carbon-free TEM microgrids by metal sputtering", Ultramicroscopy, vol. 109 (2009) pp. 1105-1109.*

International Search Report Written Opinion of the International Searching Authority issued in International Application No. PCT/GB2014/052454.

(Continued)

*Primary Examiner* — David E Smith
*Assistant Examiner* — Hsien Tsai
(74) *Attorney, Agent, or Firm* — Kenealy Vaidya LLP

(57) ABSTRACT

Some embodiments are directed to an electron microscopy sample support including: a support member; and a metal foil including a porous region. The support member is configured to give structural stability to the metal foil, and the porous region of the metal foil is configured to receive an electron microscopy sample. Also disclosed is a method of manufacturing such an electron microscopy sample sup- (Continued)

port, a method of imaging using such an electron microscopy sample support and an apparatus operable to perform such imaging. The disclosed microscopy specimen support reduces particle motion and/or sample charging in electron microscopy, and thus improve information available from electron micrographs. Appropriately designed and constructed supports may lead to an increased resolution per particle and increased accuracy of angular assignments in 3D reconstructions of, for example, biological specimens, enabling the determination of structures of smaller and more difficult proteins than was previously possible using EM techniques.

28 Claims, 8 Drawing Sheets

(52) U.S. Cl.
    CPC ............... *H01J 2237/2001* (2013.01); *H01J 2237/2004* (2013.01); *H01J 2237/26* (2013.01)

(56) References Cited

FOREIGN PATENT DOCUMENTS

| JP | S57109242 A | 7/1982 |
|----|-------------|--------|
| JP | 2008267889 A | 11/2008 |

OTHER PUBLICATIONS

Apr. 28, 2014 Search Report under Section 17(5) issued in GB1319070.7.

S. Janbroers, et al., 'Preparation of carbon-free TEM microgrids by metal sputtering', Ultramicroscopy. Aug. 2009; vol. 109, Issue 9, pp. 1105-1109.

S. Ermantraut, et al., 'Perforated support foils with pre-defined hole size, shape and arrangement', Ultramicroscopy. Jul. 1998, vol. 74, Issue 1-2, pp. 75-81.

D. Rhinow, et al., 'Electron cryo-microscopy of biological specimens on conductive titanium-silicon metal glass films.', Ultramicroscopy. Jun. 2008, vol. 108, Issue 7, pp. 698-705.

C. L. Formby (1966) Determination of foil thickness, Philosophical Magazine, 13:123, pp. 621-624, DOI: 10.1080/14786436608212655.

* cited by examiner

Electron beam-induced motion of particles in vitreous ice.

Electron beam-induced charge accumulation.

ELECTRON MICROSCOPY SAMPLE SUPPORT INCLUDING POROUS METAL FOIL

CROSS REFERENCE TO RELATED APPLICATION

This application is a National Phase filing under 35 C.F.R. § 371 of and claims priority to International Application No.: PCT/GB2014/052454, filed on Aug. 12, 2014, which claims the priority benefit under 35 U.S.C. § 119 of British Application No.: 1319070.7, U.S. Provisional Application No.: 61/865,365, and International Application No.: PCT/GB2014/051896, filed on Oct. 29, 2013, Aug. 13, 2013 and Jun. 20, 2014, respectively, the contents of which are hereby incorporated in their entireties by reference.

FIELD OF THE INVENTION

The present invention relates to an electron microscopy sample support; a method of manufacturing such an electron microscopy sample support; a method of imaging using such an electron microscopy sample support and an apparatus operable to perform such a method of imaging.

BACKGROUND

Electron microscopy techniques can be used to image a specimen. According to such techniques, a beam of electrons is used to "illuminate" a specimen. The presence of the specimen in the electron beam results in changes to that beam. The changes to the beam induced by the sample can be examined to create a magnified image of the specimen.

In order to be illuminated by an electron beam, a specimen must be adequately supported in that beam. Often the electrons forming the electron beam have a high energy and it will be appreciated that bombarding an object, for example, a specimen for examination, together with the support holding the specimen in position within the electron beam, may result in physical, chemical and/or electrical changes to the support and/or specimen. Such changes may impact results, including resolution of image, obtained through use of electron microscopy techniques.

It is desired to provide a specimen support, for use in electron microscopy, which may address some of the features of known specimen supports.

SUMMARY

Accordingly, a first aspect provides an electron microscopy sample support comprising: a support member; and a metal foil comprising a porous region; the support member is configured to give structural stability to the metal foil, and the porous region of the metal foil is configured to receive an electron microscopy sample.

The first aspect recognises that the information content in electron micrographs of specimens including, for example, nanoscale particles, can be limited by: electron beam-induced motion of individual particles; charge accumulation on the specimen induced by the electron beam and/or chemical transformation of a specimen support, for example, a carbon substrate. Such phenomena are illustrated schematically in FIGS. 1 to 3.

The phenomena described above may be of particular relevance in relation to electron cryomicroscopy, also known as cryo-electron microscopy, in which transmission electron microscopy is used to study specimens at cryogenic temperatures. Electron cryomicroscopy techniques can be particularly useful in the study of frozen, hydrated biological specimens. The loss in information content as a result of phenomena such as those alluded to previously may limit the resolution of images collected by electron cryomicroscopy in relation to such frozen hydrated biological samples, particularly in relation to 3D reconstruction of images of such samples. Known techniques impose a limit on the accuracy of angular assignments of individual particles as a result of the limited information available such that smaller particles, such as those less than ~500 kDa, cannot be aligned reliably.

The first aspect recognises that whilst the use of metal grid supports in electron microscopy is known and the use of a porous carbon film is known, the use of a fine porous metal foil to support specimens for analysis may have advantages, despite appearing, in the first instance, to be a structure which might be detrimental to resulting images. In particular, it may be thought that housing samples in the region of pores provided in a metal foil would result in poorer images, since the metal foil is not transparent to an electron beam and may cause undue interference to an incident electron beam. As a result, typically porous carbon substrates have been used, those substrates being supported by, for example, metal grids, the metal grids being operable to add mechanical stability to the specimen support and to "conduct" away electrons from a sample as required.

A sample support in accordance with the first aspect includes a metal foil, having properties selected to allow it to provide, for example, sufficient secondary electrons to a sample located in the region of a pore in the metal foil if correctly aligned within an incident electron beam. Such secondary electrons may then neutralise positive charge accumulated in the sample during exposure to an incident electron beam. The electron yield of an appropriately chosen metal may act to minimise charging effects experienced by a sample or specimen in the region of a pore of the foil. Furthermore, the metal may be selected such that it is substantially inert and non-reactive in the presence of an electron beam. The non reactive nature of an appropriately chosen metal may minimise mechanical deformation of the foil.

Although the word metal has been used to describe the porous foil of the first aspect, it will be appreciated that a material having substantially metallic properties as outlined further below may also be used, for example, an appropriately chosen semiconductor material. Typically a metal may be considered to be any material having a free charge carrier concentration greater than 10e21 per cm cubed.

In one embodiment, the metal foil is arranged to be in ohmic contact with the support member. That is to say, the contact between the metal foil and the support member acts as a non-rectifying junction, thus allowing for ease of movement of any free electrons between the foil to the support and ameliorating charging effects which may result as a result of exposure of the support to an electron beam.

In one embodiment, the metal foil comprises a metal having a large proportion of mobile electrons not tightly bound to any particular atom in the material. Materials of this sort are more conductive than typical amorphous carbon. That is to say, in some embodiments, the metal may comprise a high conductivity metal. Accordingly, provision of a high conductivity metal for the foil allows for relatively free movement of electrons within the foil, which can ameliorate charging effects which may result as a result of exposure of the support to an electron beam.

In one embodiment, the metal foil comprises a metal having a high total yield of electrons emitted by the foil for each electron incident on the foil. Accordingly, exposure to a high energy electron beam may allow generation of electrons which can fall upon a specimen or sample region, thus ameliorating charging effects which may result as a result of exposure of the sample to an electron beam.

In one embodiment, the metal foil comprises a metal having a high mechanical stability. The metal foil may comprise a metal having a mechanical strength at a selected thickness which is sufficient to reduce motion of the sample during exposure to an incident electron beam to less than the inverse of the spatial resolution desired for a resulting image. Accordingly, the foil may be configured to be self-supporting when extending across a support member. The metal foil may, if chosen to have an appropriate Young's modulus, be such that it can be relatively strong across a span between sides of a support member, despite being relatively thin by nature. Furthermore, by means of choice of a foil material which has an appropriate mechanical stability, any effects of mechanical distortion caused by chemical change or charge imbalance to the porous metal foil may be addressed. That is to say, the stiffer the material, the less likely a charge imbalance can be to cause physical warping of the foil. Ameliorating physical warping can help to ameliorate blurring caused by movement in micrograph images of a sample.

In one embodiment, the metal foil comprises a non-reactive metal. Accordingly, exposure to a high energy electron beam may result in few chemical changes in the metal foil and thus any effects of mechanical distortion caused by chemical changes to the porous metal foil may be ameliorated.

In one embodiment, the metal foil comprises a metal compatible with a biological electron microscopy sample. Accordingly, choice of material may be such that a reaction with a specimen is minimised. In particular, in some embodiments, the metal foil may be chosen to display little reaction with a biological substance.

In one embodiment, the metal foil comprises at least one of a: gold, platinum, palladium, hafnium or rhodium metal foil. Accordingly, such materials, and similar materials, may be chosen since they have an appropriate: grain size, are non-oxide forming, have a desired Young's modulus, secondary electron yield, or other similar desirable and/or tunable characteristics.

In some embodiments, individual pores in the metal foil are dimensioned such that they are comparable to an area to be interrogated by an incident electron beam of an electron microscope. Accordingly, an electron microcope beam may be operable to view the entire of a single pore. In some embodiments, each pore, or hole is dimensioned to allow the simultaneous imaging of a plurality of electron microscopy samples of interest in a single hole. In some embodiments, each pore is dimensioned to be smaller than the size of an incident electron microscope electron beam. Accordingly, an incident beam may be arranged to cover the sample housed in the pore and extend onto, or overlap, a region of metal foil surrounding the hole or pore. The overlap of beam onto metal foil can help to ensure uniform charge neutralisation of a sample by secondary electrons generated as a result of the incident electron beam onto the foil. In one embodiment, the porous region of the metal foil comprises a layer of metal including a plurality of holes. The porous region may extend across substantially all of the metal foil held in place by the support member. In some embodiments, only a region of the foil may include holes. Those holes may be regularly or irregularly arranged in the porous region. In some embodiments, those holes may be substantially uniform in size. In some embodiments, the size of the holes may vary across the foil. That is to say, a plurality of porous regions may be provided on the metal foil, each having a different pore size. Alternatively, pores of different sizes may be provided across the porous region of the metal film. Accordingly, a number of conditions can be tested on a single grid.

In one embodiment, the holes are dimensioned to receive at least one electron microscopy sample. Accordingly, at least one sample may be seen by an interrogating electron beam when the sample held in position by the support is irradiated. That is to say, in one embodiment, the metal foil has a thickness selected to be at least the smallest dimension of the electron microscopy sample.

In one embodiment, the support member comprises a substantially annular element. The cross-sectional shape of that annulus may, for example, be substantially circular, oval, rectangular or triangular. Accordingly, the metal foil may extend across said annular element.

In one embodiment, the support member comprises a plurality of spaced support elements. In one embodiment, the plurality of spaced support elements are arranged to form a mesh. Accordingly, the support member may comprise an annular element which supports a grid-like structure. That grid-like structure may then support, between adjacent mesh elements, the metal foil. Such a grid may provide additional structural stability to the metal foil. In one embodiment, the porous region of the metal foil is arranged to extend across a region of the mesh.

In one embodiment, the support member and the support elements comprise a metal. In one embodiment, the metal comprises at least one of: gold, platinum, palladium, or hafnium. Accordingly, the support may be metal or have metallic properties which can be selected so as to minimise charging, chemical and/or other similar motion-inducing processes which may occur on exposure of the support structure to a high energy electron beam.

In one embodiment, the support member, support elements and metal foil are all formed from the same metal. Accordingly, the main components forming the sample support are formed from a material having substantially the same thermal expansion coefficient (TEC). As a result, stress, strain, stretching or tearing induced in the metal foil may be mitigated, where those changes are induced by a change in temperature, such as that experienced when a sample support is reduced to, for example, liquid nitrogen temperatures. If the support is fabricated such that the foil is under tension, matching the thermal coefficient of the sample support and/or support element(s) to the thermal coefficient of the metal foil can help to mitigate the likelihood of damage to the foil and relative movement between the foil and the sample support and/or support element(s). Furthermore, it will be appreciated that such thermal matching between support components may be desirable to maintain a prescribed amount of tension in the metal foil membrane during cooling to keep the flexural rigidity of the membrane across a range of temperatures.

In one embodiment, the support further comprises a graphene layer. In some embodiments, that graphene layer may comprise a thin film. Accordingly, a graphene layer is provided which may be substantially transparent to an incident electron beam.

In one embodiment, the graphene layer is configured to extend across pores in the porous region of the metal foil. As a result of the transparent nature of graphene, provision of such a layer in said sample support may allow for additional structural stability, whilst not degrading the quality of resultant images.

In one embodiment, the graphene layer is configured to be in ohmic contact with the metal foil. Accordingly, the impact of the provision of a graphene layer in the sample support may be minimised, and the benefits of a porous metal foil maintained.

In one embodiment, the graphene layer is configured to support the electron microscopy sample. Accordingly, the graphene layer, which may extend across pores in the metal foil, may be used as a surface upon which to support a sample, or form a thin layer containing a sample, such that the graphene surrounds, or encloses a sample. The continuous layer of graphene may allow for creation of a more uniform sample containing structure.

In one embodiment, holes in the porous region of the metal foil are configured to receive a radiation sensitive material to be examined using electron microscopy. The samples to be examined may sit over, under or in the pores of the porous metal foil. The radiation sensitive material may comprise a protein. That protein may be substantially destroyed by the electron microscopy process. In one embodiment, the radiation sensitive material comprises biological material. In one embodiment, the biological material is supported in said porous region of said metal foil in vitreous ice.

Accordingly, the structure of the ice may not interrupt imaging of the sample or specimen of interest.

In some embodiments, the sample support comprises an electron cryomicroscopy sample support. Some of the issues described herein may be of particular relevance in the electron cryomicroscopy field, and thus the sample support of aspects and embodiments may find particular applicability in such a field.

A second aspect provides a method of manufacturing an electron microscopy sample support, the method comprising: providing a support member; and a metal foil comprising a porous region; configuring the support member to give structural stability to the metal foil, and configuring the porous region of the metal foil to receive an electron microscopy sample.

In one embodiment, forming the metal foil may comprise metal deposition on a template.

In one embodiment, forming the metal foil may comprise removal of the template after metal deposition.

In one embodiment, the method comprises arranging the metal foil to be in ohmic contact with the support member.

In one embodiment, the metal foil comprises a metal having a high conductivity.

In one embodiment, the metal foil comprises a metal having a high secondary electron generation yield.

In one embodiment, the metal foil comprises a metal having a high mechanical stability.

In one embodiment, the metal foil comprises a non-reactive metal.

In one embodiment, the metal foil comprises a metal compatible with a biological electron microscopy sample.

In one embodiment, the metal foil comprises at least one of a: gold, platinum, palladium, or hafnium metal foil.

In one embodiment, the porous region of the metal foil comprises a layer of metal including a plurality of holes.

In one embodiment, the method comprises providing holes dimensioned to receive at least one electron microscopy sample.

In one embodiment, the method comprises selecting a metal foil having a thickness of at least the smallest dimension of the electron microscopy sample.

In one embodiment, the support member comprises a substantially annular disc.

In one embodiment, the support member comprises a plurality of spaced support elements.

In one embodiment, the method comprises arranging the plurality of spaced support to form a mesh.

In one embodiment, the method comprises arranging the porous region of the metal foil such that it extends across a region of the mesh.

In one embodiment, the support member and the support elements comprise a metal.

In one embodiment, the metal comprises at least one of: gold, platinum, palladium, or hafnium.

In one embodiment, two or more of: the support, the support element(s) and the metal foil comprise: one or more materials having substantially matched thermal expansion coefficients. In one embodiment, two or more of: the support, the support element(s) and the metal foil comprise: the same material and have substantially matched thermal expansion coefficients.

In one embodiment, the method further comprises providing a graphene layer.

In one embodiment, the method comprises configuring the graphene layer to extend across pores in the porous region of the metal foil.

In one embodiment, the method comprises configuring the graphene layer to be in ohmic contact with the metal foil.

In one embodiment, the method comprises configuring the graphene layer to support the electron microscopy sample.

In one embodiment, the method comprises configuring holes in the porous region of the metal foil to receive a radiation sensitive material to be examined using electron microscopy.

In one embodiment, the radiation sensitive material comprises biological material.

In one embodiment, the method comprises supporting biological material in said porous region of said metal foil in vitreous ice.

A third aspect provides a method of imaging an electron microscopy sample comprising: configuring the electron microscopy sample on a support according to the first aspect; arranging the support in an electron beam of an microscope; and collecting image data for analysis.

A fourth aspect provides imaging apparatus operable to provide an electron microscopy image of a sample, the imaging apparatus comprising: an electron microscopy sample mounted on a support in accordance with the first aspect; an electron beam of a microscope arranged to be incident on the support; and a collection device operable to collect image data for analysis.

Further particular and preferred aspects are set out in the accompanying independent and dependent claims. Features of the dependent claims may be combined with features of the independent claims as appropriate, and in combinations other than those explicitly set out in the claims.

Where an apparatus feature is described as being operable to provide a function, it will be appreciated that this includes an apparatus feature which provides that function or which is adapted or configured to provide that function.

BRIEF DESCRIPTION OF THE DRAWINGS

Embodiments of the present invention will now be described further, with reference to the accompanying drawings, in which.

DESCRIPTION OF THE EMBODIMENTS

It has been recognised that the information content in electron micrographs of specimens including, for example, nanoscale particles, can be limited by: electron beam-induced motion of individual particles; charge accumulation on the specimen induced by the electron beam and/or chemical transformation of a specimen support, for example, a carbon substrate. Such phenomena are illustrated schematically in FIGS. 1 to 3.

Figure 1:
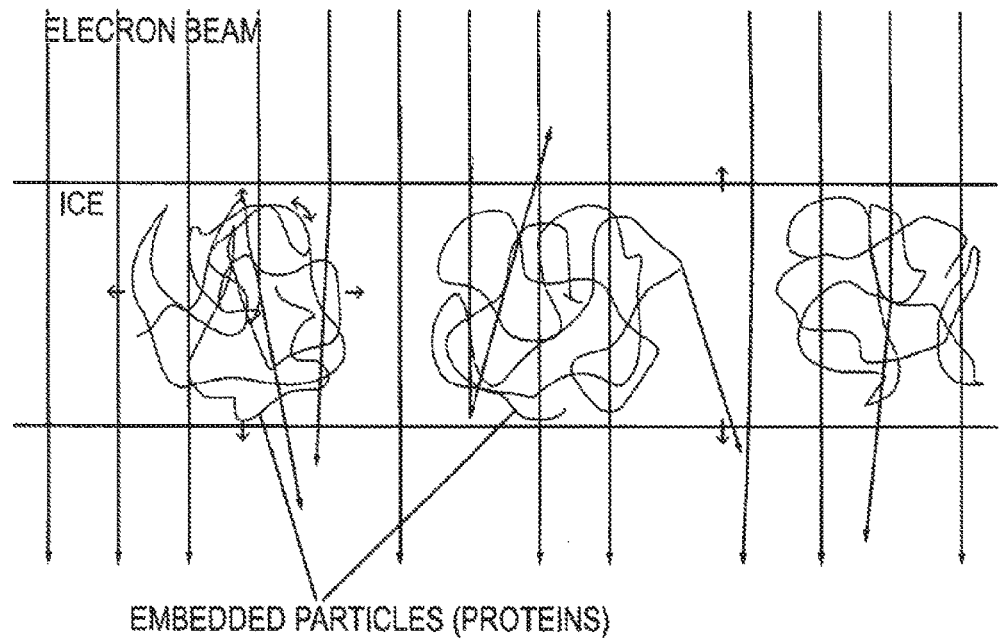
FIG. 1 illustrates schematically electron beam-induced motion of particles in vitreous ice.

FIG. 1 illustrates schematically electron beam-induced motion of particles in vitreous ice. FIG. 1 illustrates particles, in this instance, proteins, embedded in vitreous ice. The sample is irradiated with an electron beam. The electrons forming the beam have energy which is imparted to the protein samples when colliding with, or passing through, those samples. It will be appreciated that, during imaging, particles being studied may move both rotationally and translationally upon irradiation with the electron beam, causing blurring in resulting captured images.

Figure 2:
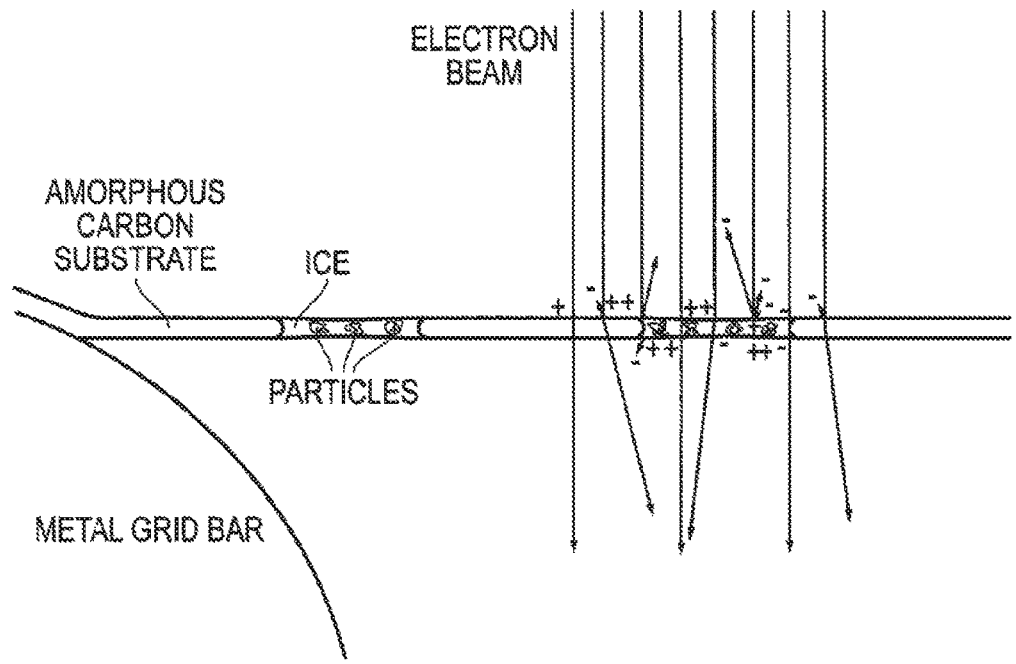
FIG. 2 illustrates schematically electron beam-induced sample charge accumulation.

FIG. 2 illustrates schematically electron beam-induced sample charge accumulation. FIG. 2 shows schematically samples, again proteins, held in position in vitreous ice formed in holes in an amorphous carbon substrate supported between bars of a metal grid. Irradiation of the samples and support (formed, in this instance, from a metal grid and amorphous carbon substrate) with high energy electrons forming an electron beam may cause release or movement of electrons forming part of the sample and/or support. The resulting movement or displacement of electrons can result in sample charging which may introduce electrical forces that act on the sample and substrate, causing particle movement and image blurring by deflection of the electron beam.

Figure 3:
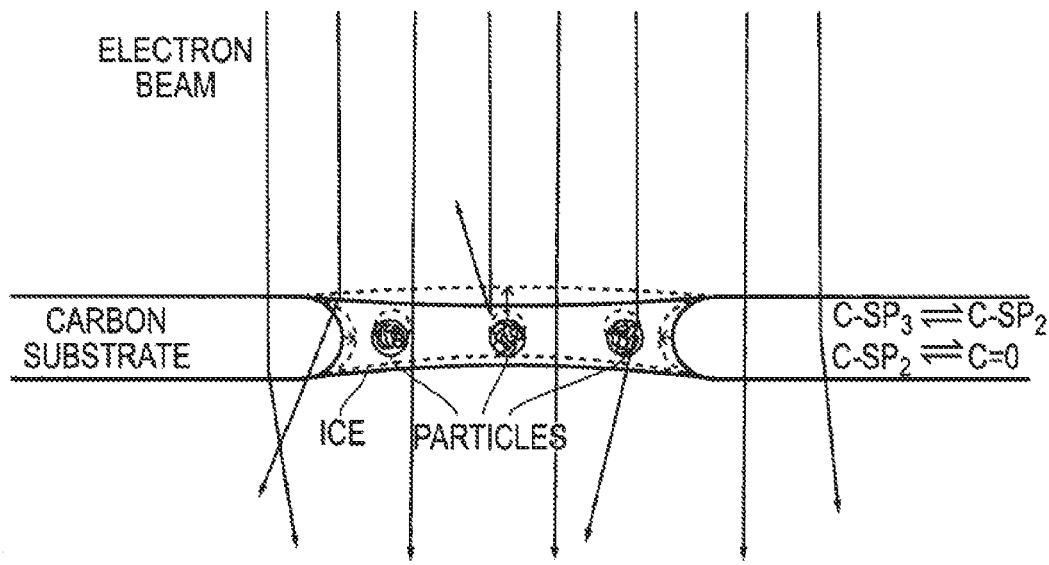
FIG. 3 illustrates schematically electron beam-induced chemical transformation of a support substrate.

FIG. 3 illustrates schematically electron beam-induced chemical transformation of a support substrate. In the arrangement shown in FIG. 3 particles, in this instance, proteins, are embedded in vitreous ice. That vitreous ice is formed in a hole formed in a carbon substrate. The sample is irradiated with an electron beam. Irradiation with a high energy electron beam may result in the electrons forming the beam acting to break chemical bonds in the carbon substrate, which in turn can alter the density and shape of the substrate. The change in density and shape of the substrate may induce mechanical stress and motion and cause "doming" of the ice layer. That doming of the ice layer, supporting the particles may cause blurring in the resulting electron microscopy image.

Current sample supports and substrates for cryo-EM typically comprise a metal mesh disc, referred to as a "grid" formed from a suitable material. That suitable material may comprise a metal. The grid is typically covered with a thin layer of holey amorphous carbon. The grid may have a regular array of holes. The thin layer of holey amorphous carbon may comprise a regular array of holes. Irregular "lacey" carbon substrates may also be used. It will be appreciated that in the case of cryo-EM, vitreous ice is often used to encapsulate samples in holes formed in the amorphous carbon. Since ice is an insulator and amorphous carbon is a poor and highly variable conductor, both accumulate significant mobile surface charge that can deflect an electron beam and exert strong electrostatic forces on the sample, as shown in FIG. 2 and FIG. 3. Furthermore, if amorphous carbon is irradiated by a high energy electron beam, it may undergo chemical changes which may change the density and therefore the shape of the amorphous carbon support material, thus causing movement of individual particles in a sample.

Overview

Before discussing the embodiments in any more detail, first an overview will be provided. Aspects and embodiments described herein may provide an ultra-stable sample support which may ameliorate, reduce or eliminate each of the problems with supports used for electron microscopy described above.

Figure 4A:
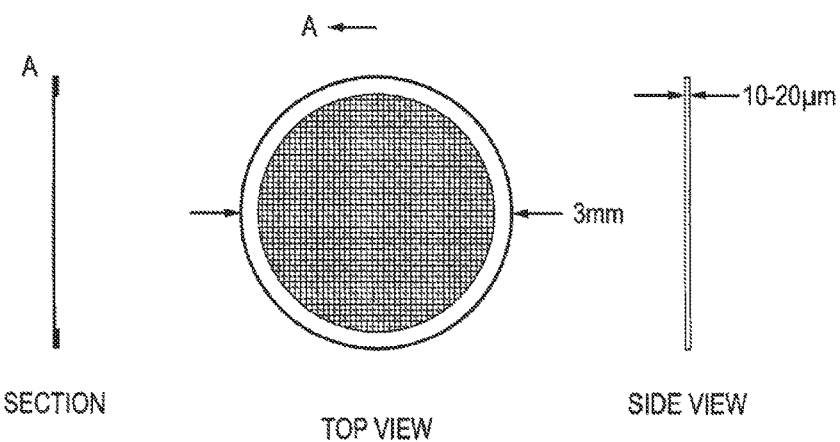
FIG. 4a illustrates schematically a sectional, plan, and side elevation of an electron microscopy support in accordance with one embodiment.

FIG. 4a illustrates schematically a sectional, plan, and side elevation of an electron microscopy support in accordance with one embodiment. FIG. 4a illustrates an electron microscopy sample support comprising: a support element, in this instance, a substantially annular member together with a metal grid and a metal foil which extends between adjacent trusses of the metal grid. The metal foil comprises a porous region. The support element is configured to give structural stability to the porous metal foil. The porous region of the metal foil is configured to receive an electron microscopy sample. In some embodiments the electron microscopy support comprises a perforated gold foil mounted on a gold mesh grid.

Figure 4B:
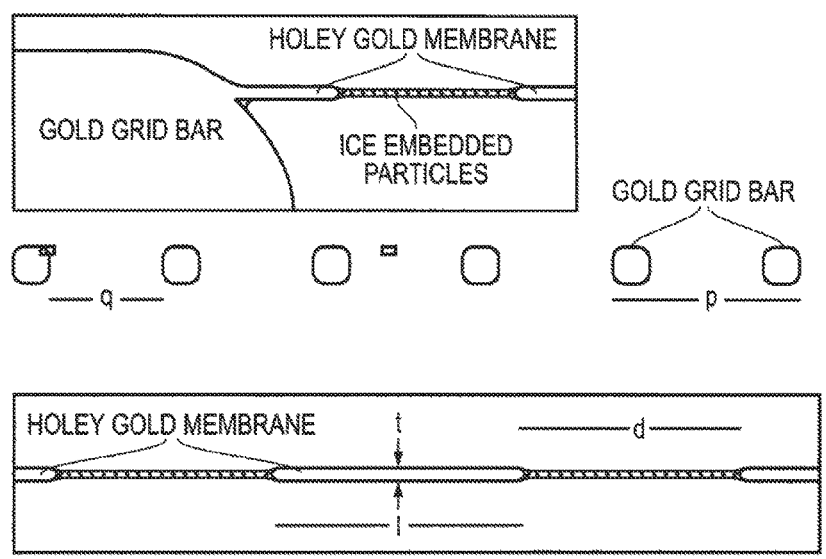
FIG. 4b illustrates schematically a portion of the electron microscopy support shown in FIG. 4a in more detail.

FIG. 4b illustrates schematically a portion of the electron microscopy support shown in FIG. 4a in more detail. In particular, FIG. 4b shows a close-up view of a suspended holey foil membrane on a grid. The insets of FIG. 4b show the support structure in detail.

Figure 5A:
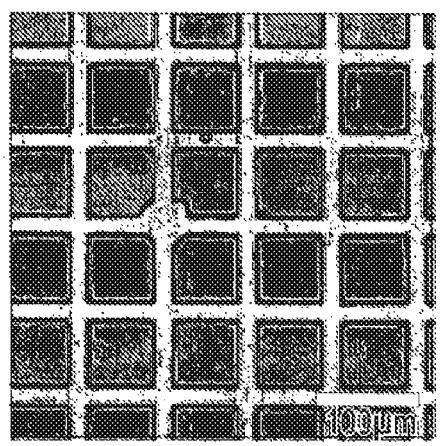
FIGS. 5a to 5c show optical and electron images of a device according to one embodiment.
Figure 5B:
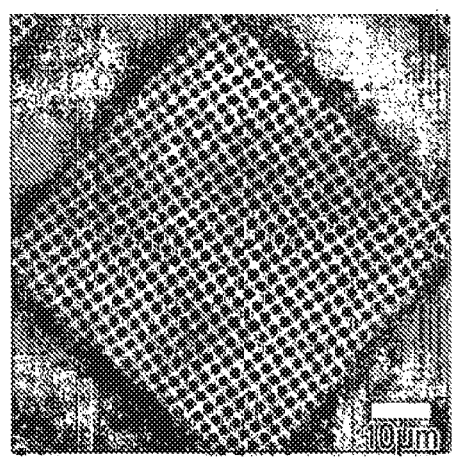
Figure 5C:
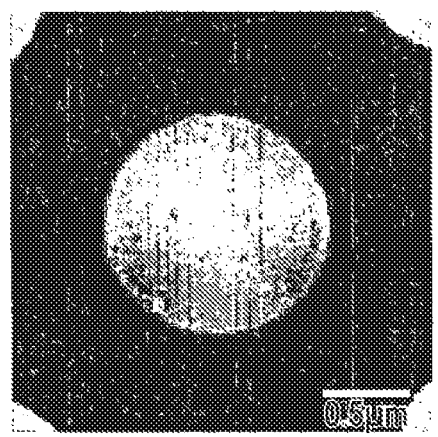

FIGS. 5a to 5c show optical and electron images of a device according to one embodiment. The scale of each image is indicated. FIG. 5a shows a low magnification optical image of a region of a device according to one embodiment. The embodiment shown comprises a 3 mm gold metal mesh "grid" which is covered in a suspended thin foil of holey gold.

FIG. 5b is a higher magnification image of the device shown in FIG. 5a and shows an individual grid square. A regular array of holes can be seen in the thin gold foil between grid supports.

FIG. 5c is a transmission electron micrograph of an individual hole in the foil of the embodiment of FIG. 5a. The hole shown contains a sample comprising 70S ribosomes embedded in a thin layer of ice.

It will be appreciated that various parameters of a support in accordance with aspects and embodiments may be altered in order to construct a support suited to a range of electron microscopy applications of interest. In particular, parameters including those listed herein may be tuned to provide a support suited to a specimen of interest:

Choice of Material

In the embodiments shown in FIGS. 4 and 5, gold is selected to be a suitable metal material for both the porous metal foil and the support structure. The support structure of the embodiment of FIG. 4 and FIG. 5 takes the form of a grid, itself mounted on an annular support. Gold is highly conductive (resistivity 2.3 μΩ cm compared to ~1400 μΩ cm for amorphous carbon) and placing the perforated gold foil on top of a gold grid generates a continuous electrical ground plane with no discontinuity in the thermal expansion coefficient.

Furthermore, the number of secondary electrons generated from a gold substrate is far greater than from a carbon substrate, or indeed from many other candidate metals. The number of secondary electrons generated can be an important consideration in the design of a support, since secondary electrons, generated when an electron beam of an electron microscope hit a substrate, act to neutralize any positive surface charge on a specimen.

Gold has a similar mechanical stability to carbon. The Young's modulus of gold is comparable to that of amorphous carbon: 79 GPa for gold and ~100 GPa for carbon). In contrast, gold is not subject to chemical transformation and is therefore more stable in an electron beam.

It will be appreciated that this combination of material properties make gold a particularly suited metal for the perforated foil forming the specimen support. Other metals having similar properties are also suitable substrates, for example, platinum, palladium, rhodium or hafnium.

Thickness of Gold Foil

The thickness (t in FIG. 4b) of the perforated metal foil layer is a tunable parameter of a support in accordance with aspects and embodiments described herein. The minimum thickness of the metal foil is set by the size of the evaporated metal grains. Take, for example, a gold foil. The gold foil of the specimen support must be thicker than the gold grain to provide sufficient mechanical stability and uniform electrical conductivity. The thickness of the perforated metal, for example, gold, foil also affects the thickness of, for example, the ice which fills holes in the foil and holds specimens in position in those holes. The maximum metal foil thickness may be selected in dependence upon the desired ice thickness, which in turn is set by specimen particle dimensions. Taking such factors into consideration gives, in one example, a perforated gold foil should be ~500 Å or the diameter of the specimen particle of interest, whichever is greater.

Aspect Ratio of Holes

There may be practical limitations when designing a support in relation to the aspect ratio of holes (t/d in FIG. 4) in the metal foil. Those limitations may be dictated by, for example, practical constraints in fabrication and the size of the field of view of an electron microscope of interest. The diameter (d) of the hole may, in some embodiments, be selected to match the field of view of an electron microscope of interest such that the microscope electron beam can be arranged to uniformly illuminate a hole in the metal foil, that hole containing ice in which specimens may be encapsulated, together with a "ring" of metal, for instance, gold, encompassing and encircling the edge of the perforation in the metal foil. In one embodiment, the optimal diameter is given by the minimal size that meets the above criteria at a selected imaging magnification. Larger holes may typically suffer from increased charging and beam induced motion since they comprise larger regions of insulating ice. For example, for typical imaging conditions in a modern electron microscope, at 39,000× magnification and with a beam diameter of 1.2 μm, the optimal foil perforation hole size can be calculated to be d approximately equal to 1 μm.

Graphene Devices

According to some embodiments, a sample support may further comprise a graphene layer. In such embodiments, a layer of graphene may be incorporated into the support substrate. Such a graphene layer may be arranged such that is located on top of the perforated metal foil. In some embodiments, the graphene layer may be arranged to sit between the support grid and the perforated metal foil.

Provision of a graphene layer in the support may be such that the graphene layer can act to further decrease surface charge build up. That further reduction may come as a result of the conductive properties of graphene. According to the embodiments in which graphene is incorporated, the graphene is arranged to be in ohmic contact with the metal foil. The graphene may also be in ohmic contact with the support. Provision of a graphene layer in a support may be such that it acts to increase the mechanical strength of the substrate.

In a support arrangement in which a layer of graphene is provided above the metal foil provision of that graphene layer may be such that a substantially uniform coating including one or more samples or specimens for analysis may be arranged to extend across said graphene layer. Such an arrangement may allow control of the thickness of the coating layer including one or more samples. In such an arrangement, the thickness of a coating, for example, an ice layer including protein samples, may be controlled independently of the thickness of the metal foil.

In a support arrangement in which a layer of graphene is provided beneath the metal foil, the graphene layer may be arranged such that a substance containing one or more samples for analysis may be supported in holes or pores in the metal film by the graphene.

Provision of a graphene layer in a support according to some embodiments may be such that the mechanical stability of the support and/or sample for analysis is improved.

Furthermore, selection of appropriate graphene may be such that inclusion of such a layer can be useful when examining biological samples, since it may allow for the controlled deposition of proteins on the support.

Method of Production

It will be appreciated that various methods of production may be employed to construct a sample support in accordance with aspects and embodiments described herein. By way of example only, to produce one embodiment of a device in accordance with one embodiment, a gold grid having a suspended layer of perforated amorphous carbon on top can be used as a template. It will be appreciated that other types of template can be used, including: lacey carbon, nanoporous polycarbonate and other patterned plastics.

Gold is then evaporated onto the suspended template. The template is subsequently removed by exposing the device to a low energy oxygen/argon plasma. The plasma can be tuned such that it reacts very strongly with all carbon-containing materials but has no effect on the gold. Such an arrangement allows for selective removal of substantially all of the template layer, leaving a perforated pure gold foil directly attached to a pure gold mesh grid.

Figure 6:
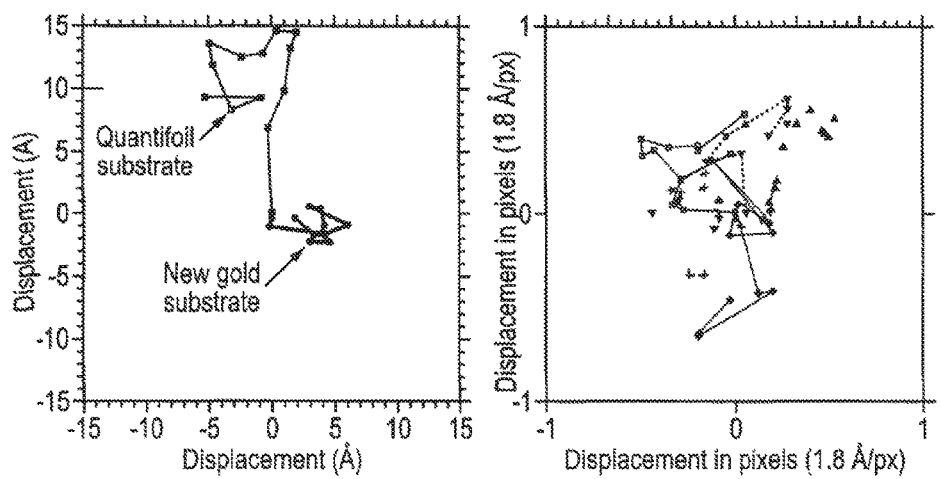
FIG. 6 shows results of one experiment to measure gold particle motion in vitreous ice in example electron microscopy supports.

FIG. 6 shows results of one experiment to measure gold particle motion in vitreous ice in example electron microscopy supports. By imaging gold particles it can be shown that there is reduced specimen motion when imaged on an ultra-stable sample support in accordance with one embodiment. The left panel of FIG. 6 illustrates a typical motion trajectory for a specimen in ice on a typical substrate (red curve) against a typical trajectory for a specimen in ice on our ultra-stable grids (black curve). The right panel of FIG. 6 shows five individual specimen trajectories determined when using a support in accordance with one embodiment. It can be seen that the motion is less than the accuracy with which the specimens can be located, that is to say, less than one Ångstrom per time point. Note the scale on the right panel of FIG. 6 is displacement in pixels.

Experimental Use of Support

It has been found that samples and specimens prepared on an ultra-stable sample supports according to one embodiment display reduced charging when placed in an electron beam. The "bee-swarm effect" is a fluctuation in the granularity of images at low magnification and is a result of surface charging. The "bee-swarm effect" with a typical support has been compared to the effect experienced when using an ultra-stable substrate according to one embodiment and it was found that the effect is greatly reduced, indicating that sample/specimen charging is likely to be reduced when using a support in accordance with aspects and embodiments described herein.

Embodiments can be designed such that during imaging an electron beam of an electron microscope illuminates metal around the entire circumference of the porous hole which contains the specimen, in some cases, encapsulated in vitreous ice. Such an arrangement may allow for uniform generation of secondary electrons by the metal foil. Those secondary electrons can neutralize positive charges generated within and on the surface of the ice in the pore of the foil. When the electron beam is arranged to be off-centre with respect to the hole, the electron beam does not touch metal, for example, gold, around the entire circumference of the pore and a blurring in the resultant image can be observed. That blurring may be indicative that secondary electrons from the metal, for example, gold foil, are important in neutralizing any charging phenomenon experienced by the specimen.

In comparison to standard EM substrates, samples and specimens prepared on ultra-stable supports according to some embodiments appear to have decreased particle motion and suffer decreased charging effects. The decreased particle motion increases the contrast in each resulting image due to reduced blurring. Decreased particle motion may be a result of, for example: high mechanical stability, reduced force on the ice due to reduced charge build-up, and elimination of chemical changes in the support which would induce stresses in a perforated foil membrane. Decreased charging effects may further improve the phase contrast of images by reducing charge induced lensing of the electron beam.

Figure 7:
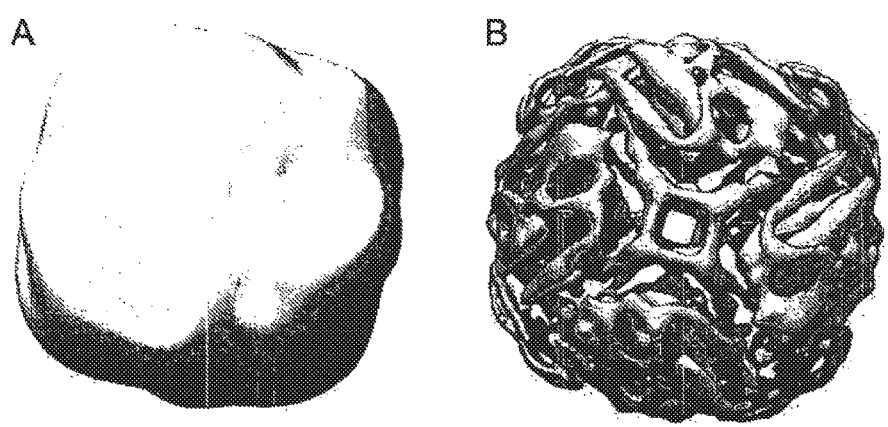
FIGS. 7a and 7b show a comparative example of a specimen imaged using a support in accordance with one embodiment.

FIGS. 7*a* and 7*b* show a comparative example of a specimen imaged using a support in accordance with one embodiment. In particular, FIGS. 7*a* and 7*b* show 3D electron density maps made using the same number of images of the same protein sample on (a) standard holey carbon grids and (b) a support in accordance with one embodiment. The alpha helices of the protein sample are clearly resolved in FIG. 7*b* as cylindrical regions of electron density. The diameter of apoferritin, the octahedral protein of molecular mass 450 kDa imaged in FIGS. 7*a* and 7*b* is 120 Å. Alignment of a plurality of apoferritin images to construct a 3D image requires information at resolutions greater than $\frac{1}{10}$ Å. Using cryo-EM on conventional grids, it has not been possible to determine the 3D structure of apoferritin (FIG. 7*a*). Using images obtained by using a support in accordance with one embodiment, a 3D reconstruction of apoferritin has been generated (FIG. 7*b*). Such an image demonstrates that a sample support in accordance with aspects and embodiments described herein may be such that the information content in electron micrographs where spatial information whose frequency is greater than $\sim\frac{1}{10}$ Å is significantly improved.

Specimen supports in accordance with aspects and embodiments may reduce particle motion and/or sample charging in electron microscopy, and thus improve information content available from electron micrographs. Appropriately designed and constructed supports may lead to an increased resolution per particle and increased accuracy of angular assignments in 3D reconstructions of, for example, biological specimens. This may enable the determination of structures of smaller and more difficult proteins than was previously possible using EM techniques.

Figure 8A:
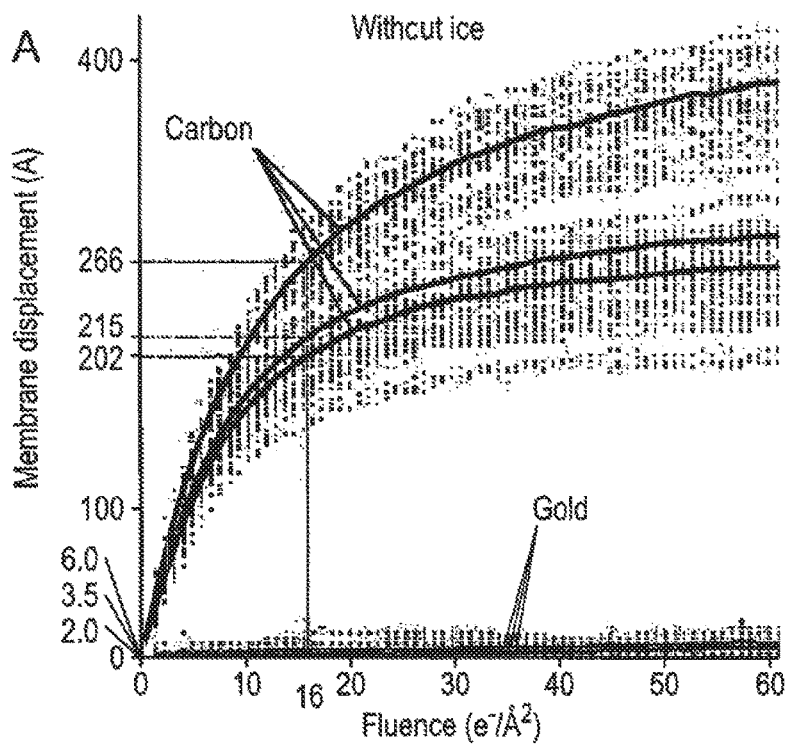
FIGS. 8a and 8b show experimental results illustrating reduced motion of gold grid supports in accordance with an arrangement compared to conventional amorphous carbon grid supports.
Figure 8B:
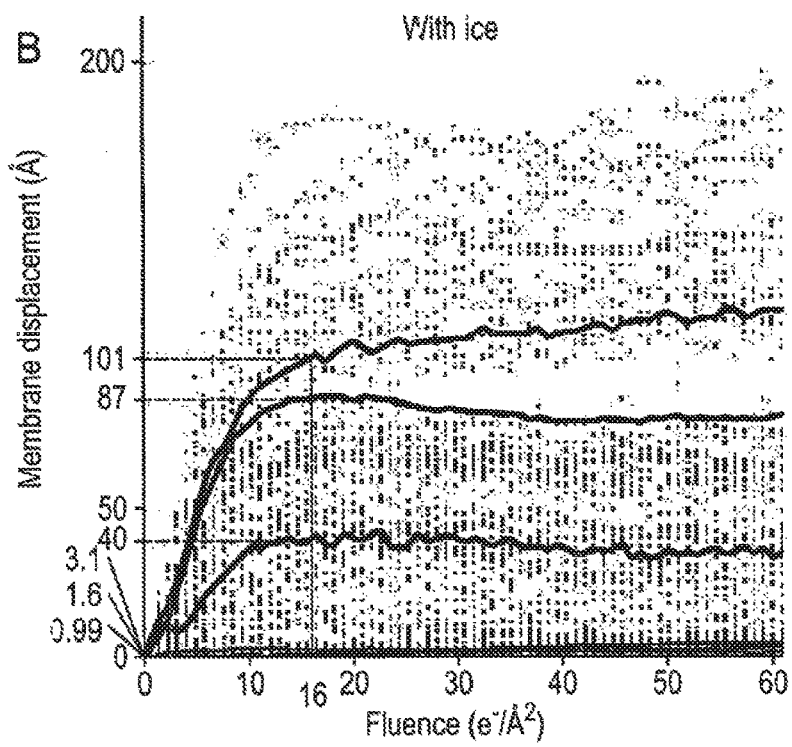

FIGS. 8*a* and 8*b* show experimental results illustrating reduced vertical motion of gold grid supports in accordance with an arrangement compared to conventional amorphous carbon grid supports. In general FIGS. 8*a* and 8*b* illustrate graphically the reduced motion of gold grids under high-energy electron irradiation when compared to conventional amorphous carbon grids. Each point shown in the plots of FIGS. 8*a* and 8*b* represents the r.m.s. vertical displacement of a particular hole in, for example, the carbon substrate (upper points and lines) or gold substrate (lower points and lines) relative to its initial position before electron irradiation. Each solid line is the average displacement for multiple holes in multiple squares of one grid. It can be seen from FIG. 8*a* that conventional amorphous carbon grids exhibit large degree of motion perpendicular to the plane of the grid under typical cryo-EM illumination conditions (300keV, 16 e/°A2/s and 80K). The lower points and curves shown in FIG. 8*a* represent the same measurement in relation to gold grids.

FIG. 8*b* comprises an analogous measurement and analysis performed in relation to amorphous carbon grid supports (upper points and lines) and a gold support (lower points and lines) when a typical thin layer of vitreous ice is present. It can be seen that the vertical motion is reduced about two-fold relative to grids without ice and that, in general, the motion becomes more complicated in nature. In both cases there is on average a 50 fold reduction in the vertical motion of the grid during the first 16 e/°A2 of irradiation for gold grids compared to use of conventional amorphous carbon grids.

Figure 9A:
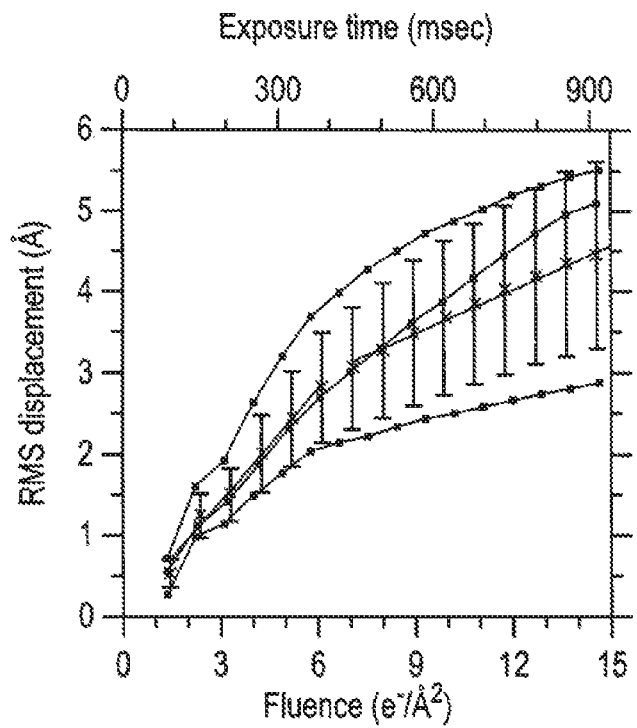
FIGS. 9a to 9d show experimental results illustrating average 80S ribosome displacement from an initial position as a plot against time/electron fluence for data collected in ice using a variety of microscopy support structures.
Figure 9B:
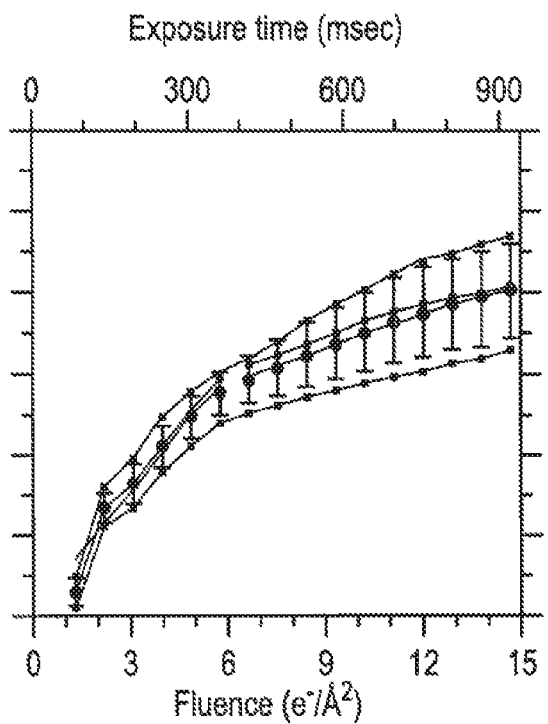
Figure 9C:
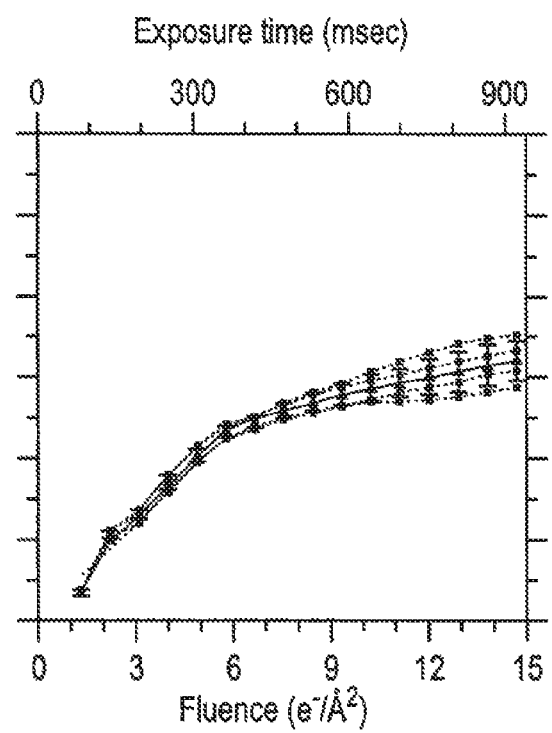
Figure 9D:
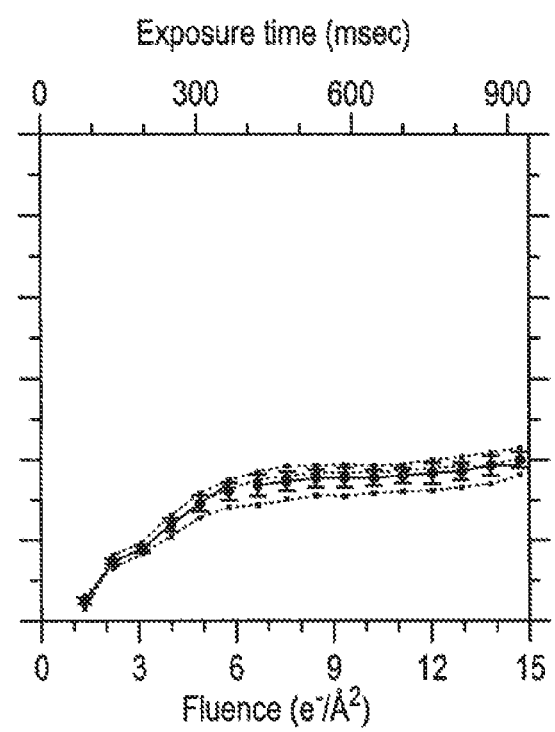

FIGS. 9*a* to 9*d* show experimental results illustrating average 80S ribosome displacement from an initial position as a plot against time/electron fluence for data collected in ice using a variety of microscopy support structures. In particular, FIG. 9*a* relates to a sample supported by a continuous layer of amorphous carbon; FIG. 9*b* relates to a sample without any support layer on amorphous carbon perforated support membranes; FIG. 9*c* relates to a sample supported on a graphene substrate; and FIG. 9*d* relates to a sample on unsupported ice on gold substrates. All plots (FIGS. 9*a* to 9*d*) have the same scale. Each point (dotted lines) represents the root mean squared (RMS) displacement of thousands of particles from a single grid, whose positions were measured using a five-frame running average under constant electron beam irradiation (300 keV; 16 e-/Å2/s). The solid lines of FIGS. 9*a* to 9*d* are the linear fits to the two phases of motion. Error bars represent the standard error of the mean of replicate experiments (3 separate grids in relation to FIGS. 9a, b, d and 4 for FIG. 9c).

Although illustrative embodiments of the invention have been disclosed in detail herein, with reference to the accompanying drawings, it is understood that the invention is not limited to the precise embodiment and that various changes and modifications can be effected therein by one skilled in the art without departing from the scope of the invention as defined by the appended claims and their equivalents.

The work leading to this invention has received funding from the European Research Council under the European Union's Seventh Framework Programme (FP7/2007-2013)/ERC grant agreement no 261151.

The invention claimed is:

1. An electron microscopy sample support, comprising:
 a metal support member including a plurality of spaced support elements arranged to form a mesh; and
 a metal foil including a porous region;
 the support member being configured to give structural stability to the metal foil, and the porous region of the metal foil being configured to receive an electron microscopy sample,
 wherein the support member, the plurality of spaced support elements, and the metal foil are all formed from the same metal.

2. The electron microscopy sample support according to claim 1, wherein the metal foil is arranged to be in ohmic contact with the support member.

3. The electron microscopy sample support according to claim 1, wherein the metal foil includes a metal having a high conductivity.

4. The electron microscopy sample support according to claim 1, wherein the metal foil includes a metal having a high secondary electron generation yield.

5. The electron microscopy sample support according to claim 1, wherein the metal foil includes a metal having a high mechanical stability.

6. The electron microscopy sample support according to claim 1, wherein the metal foil includes a non-reactive metal.

7. The electron microscopy sample support according to claim 1, wherein the metal foil includes a metal compatible with a biological electron microscopy sample.

8. The electron microscopy sample support according to claim 1, wherein the metal foil includes at least one of a: gold, platinum, palladium, rhodium or hafnium metal foil.

9. The electron microscopy sample support according to claim 1, wherein the porous region of the metal foil includes a layer of metal including a plurality of holes.

10. The electron microscopy sample support according to claim 9, wherein each of the holes are dimensioned to receive at least one the electron microscopy sample.

11. The electron microscopy sample support according to claim 1, wherein the metal foil has a thickness selected to be at least the smallest dimension of the electron microscopy sample.

12. The electron microscopy sample support according to claim 1, wherein the support member includes a plurality of spaced support elements.

13. The electron microscopy sample support according to claim 12, wherein the plurality of spaced support elements are arranged to form a mesh.

14. The electron microscopy sample support according to claim 11, wherein the porous region of the metal foil is arranged to extend across a region of the plurality of spaced support elements.

15. The electron microscopy sample support according to claim 1, wherein the support member includes a metal.

16. The electron microscopy sample support according to claim 15, wherein the metal includes at least one of: gold, platinum, palladium, rhodium, or hafnium.

17. The electron microscopy sample support according to claim 1, wherein the support further includes a graphene layer.

18. The electron microscopy sample support according to claim 17, wherein the graphene layer is configured to extend across pores in the porous region of the metal foil.

19. The electron microscopy sample support according to claim 17, wherein the graphene layer is configured to be in ohmic contact with the metal foil.

20. The electron microscopy sample support according to claim 17, wherein the graphene layer is configured to support the electron microscopy sample.

21. The electron microscopy sample support according to claim 1, wherein pores in the porous region are configured to receive a radiation sensitive material to be examined using electron microscopy.

22. A method of manufacturing an electron microscopy sample support, the method comprising:
 providing a metal support member including a plurality of spaced support elements arranged to form a mesh; and
 a metal foil including a porous region;
 configuring the support member to give structural stability to the metal foil;
 configuring the porous region of the metal foil to receive an electron microscopy sample; and
 forming all of the support member, the plurality of spaced support elements, and the metal foil from the same metal.

23. A method of imaging an electron microscopy sample, comprising:
 configuring the electron microscopy sample on the support according to claim 1;
 arranging the support in an electron beam of an microscope; and
 collecting image data for analysis.

24. An imaging apparatus operable to provide an electron microscopy image of a sample, the apparatus comprising:
 an electron microscopy sample mounted on the support according to claim 1;
 a microscope providing an electron beam arranged to be incident on the support; and
 a collection device operable to collect image data for analysis.

25. The electron microscopy sample support according to claim 1, wherein the metal foil has a mechanical strength at a selected thickness which is sufficient to reduce motion of the metal foil during exposure to less than $2 \times 10^{-9}$ m perpendicular to the metal foil.

26. The electron microscopy sample support according to claim 1, wherein the metal foil has the mechanical strength at the selected thickness which is sufficient to reduce motion of the metal foil during exposure to less than $2 \times 10^{-10}$ m in a plane of the metal foil.

27. The electron microscopy sample support according to claim 1, wherein the metal foil has a minimum thickness greater than an average size of evaporated metal crystal grains of the foil.

28. The electron microscopy sample support according to claim 1, wherein the metal foil is gold and has a thickness of at least $5 \times 10^{-8}$ m.

* * * * *